(12) United States Patent
Ghatge et al.

(10) Patent No.: US 11,393,973 B2
(45) Date of Patent: Jul. 19, 2022

(54) HAFNIUM-ZIRCONIUM OXIDE (HZO) FERROELECTRIC TRANSDUCER AND METHOD OF MAKING THE SAME

(71) Applicant: University of Florida Research Foundation, Incorporated, Gainesville, FL (US)

(72) Inventors: Mayur Ghatge, Gainesville, FL (US); Glen H. Walters, Gainesville, FL (US); Toshikazu Nishida, Gainesville, FL (US); Roozbeh Tabrizian, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 375 days.

(21) Appl. No.: 16/692,009

(22) Filed: Nov. 22, 2019

(65) Prior Publication Data

US 2020/0177152 A1 Jun. 4, 2020

Related U.S. Application Data

(60) Provisional application No. 62/773,536, filed on Nov. 30, 2018.

(51) Int. Cl.
*H01L 41/187* (2006.01)
*H03H 9/02* (2006.01)
(Continued)

(52) U.S. Cl.
CPC ............ *H01L 41/187* (2013.01); *H01L 27/20* (2013.01); *H01L 41/0477* (2013.01);
(Continued)

(58) Field of Classification Search
CPC .... H04R 17/10; H03H 3/02; H03H 2003/027; H03H 3/0072; H03H 3/0073; H03H 9/02015; H03H 9/02566; H03H 9/02574; H03H 9/24–2494; H03H 9/25; B81B 3/0021; B81B 2201/0271; B81C 1/00134; B81C 1/00142; B81C 1/00182; B81C 1/0019; B81C 1/00523–00547; B81C 1/00023; B81C 1/00126; B81C 1/00349; B81C 1/00373; B81C 1/0038; H01L 41/0477; H01L 41/0478; H01L 41/0805–0815; H01L 41/083;
(Continued)

(56) References Cited

U.S. PATENT DOCUMENTS

2016/0304341 A1* 10/2016 Bright ................... B81C 1/0019
2020/0228095 A1* 7/2020 Tabrizian ................. H03H 9/56

OTHER PUBLICATIONS

Riedel et al. "A thermally robust and thickness independent ferroelectric phase in laminated hafnium zirconium oxide", AIP Advances 6, 095123, 10 pages, Published: Sep. 29, 2016. (Year: 2016).*
(Continued)

*Primary Examiner* — Scott B Geyer
(74) *Attorney, Agent, or Firm* — Alston & Bird LLP

(57) ABSTRACT

A nano-mechanical acoustical resonator is designed and fabricated with CMOS compatible techniques to apply to mm-wave RF front-ends and 5G wireless communication systems which have extreme small scale and integrated in 3D sensors and actuators.

20 Claims, 15 Drawing Sheets

(51) Int. Cl.
    *H01L 41/053*     (2006.01)
    *H01L 41/316*     (2013.01)
    *H01L 41/047*     (2006.01)
    *H01L 41/08*     (2006.01)
    *H03H 3/02*     (2006.01)
    *H01L 27/20*     (2006.01)
    *H01L 41/29*     (2013.01)
    *H03H 9/13*     (2006.01)

(52) U.S. Cl.
    CPC .......... *H01L 41/053* (2013.01); *H01L 41/081* (2013.01); *H01L 41/29* (2013.01); *H01L 41/316* (2013.01); *H03H 3/02* (2013.01); *H03H 9/02031* (2013.01); *H03H 9/13* (2013.01)

(58) Field of Classification Search
    CPC ....... H01L 41/107; H01L 41/113–1138; H01L 41/18; H01L 41/27; H01L 41/29; H01L 41/31; H01L 41/35; H01L 41/37; H01L 41/187; H01L 41/314; H01L 41/316; H01L 41/319; H01L 41/332
    See application file for complete search history.

(56) References Cited

OTHER PUBLICATIONS

Liang et al. "A Ferroelectric Thin Film Transistor Based on Annealing-Free HfZrO Film", Journal of the Electron Devices Society, 6 pages, Published: Jul. 26, 2017. (Year: 2017).*

* cited by examiner

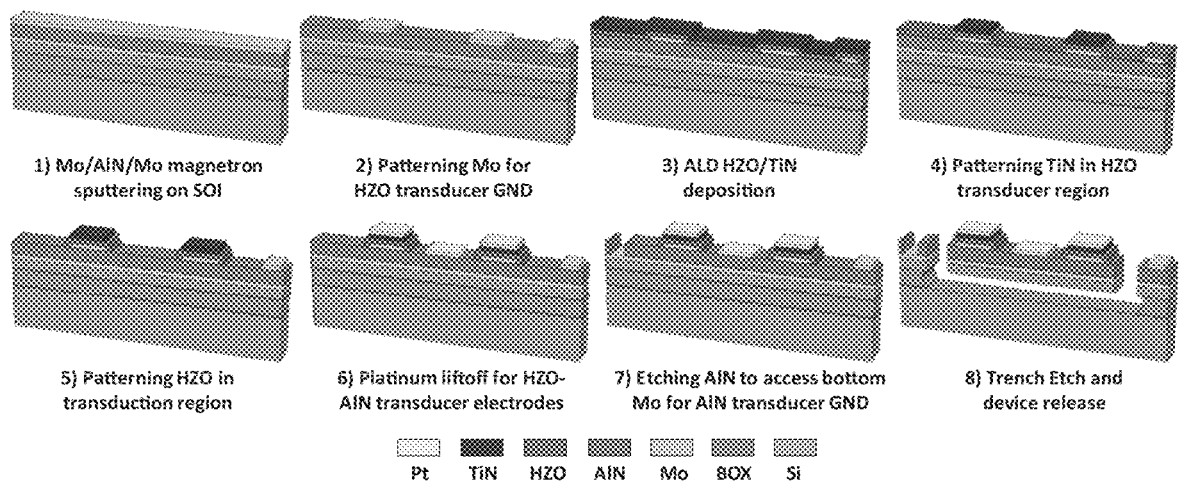
Figs. 4(1) to (8) illustrate the fabrication process flow.

HAFNIUM-ZIRCONIUM OXIDE (HZO) FERROELECTRIC TRANSDUCER AND METHOD OF MAKING THE SAME

CROSS-REFERENCES TO RELATED APPLICATIONS

This application claims priority to Provisional Application. No. 62/773,536, filed Nov. 30, 2018, which is incorporated herein by reference in its entirety.

GOVERNMENT FUNDING

This invention was made with government support under grant numbers 1610387 and 1752206 awarded by the National Science Foundation. The government has certain rights in the invention.

TECHNICAL FIELD

The present application relates to acoustic resonators, in particular, to hafnium-zirconium oxide-based piezoelectric transducers for nano-electromechanical systems.

BACKGROUND

Ever since the advent of micro and nano-electro-mechanical resonators, the need for large electromechanical coupling coefficient, extreme frequency scalability, and CMOS processing compatibility have been the governing drivers for the advancement of thin-film piezoelectric transducers. The development of high quality piezoelectric films has enabled high-performance bulk acoustic resonators and filters which are employed in RF front-end modules for wireless mobile systems.

However, the forthcoming 5G era, with the ambitious target of the extending wireless communication to the mm-wave regime, has raised an unprecedented urgency for transformation of piezoelectric films and acoustic resonator architectures. To fulfill the demand for extreme frequency scaling to mm-wave regime, the quest for material and architectural improvements of the acoustic resonator technology continues. While the development of fin-based resonator architectures and the use of single crystal films and substrates help further the scaling limits beyond the current state, the ultimate bound of the frequency scaling is set by the technological limitations in piezoelectric film thickness miniaturization. Because the frequencies of bulk acoustic resonators are inversely proportional to the thickness of the piezoelectric film, extreme frequency scaling to mm-wave regime requires radical thickness miniaturization to sub-100 nm range. Such a miniaturization is substantially inhibited by the size requirements of nucleation, crystallization, and texture development processes in current piezoelectric film deposition techniques (e.g. Magnetron-Sputtering and Metalorganic Vapor-Phase Epitaxy or MOCVD), which drastically degrade the electromechanical coupling and energy dissipation coefficients.

A scaled sub-100 nm thickness piezoelectric resonator fabricated with CMOS compatible techniques is needed to address this technological gap.

BRIEF SUMMARY

Embodiments of the current disclosure provide a two-port acoustic resonator, comprising: a substrate, a first aluminum nitride (AlN) layer on the substrate; a first molybdenum (Moly) layer disposed on the first AlN layer; a first transducer formed on the first Moly layer, wherein the first transducer comprises, a second AlN layer disposed on the first Moly layer; a second Moly layer disposed on the second AlN layer; and a second transducer formed on the second Moly layer wherein the second transducer comprises, a hafnium zirconium oxide (HZO) layer disposed on the second Moly layer; a titanium nitride (TiN) layer disposed on the HZO layer; and a first conductive layer disposed on the TiN layer; wherein the second transducer is located in the vicinity of the first transducer.

Optionally, the HZO layer is formed by applying atomic layer deposition (ALD).

Optionally, the HZO layer has a thickness ranging from 2 nm to 20 nm.

Optionally, the first and the second conductive layers include one of platinum (Pt), aluminum (Al), gold (Au), and silver (Ag).

Optionally, the first AlN layer is a seed layer and the second AlN layer is a c-axis oriented crystalline layer, and have a thickness ranging from 50 nm to 5 um.

Optionally, the substrate is a SOI having a device layer on a BOX layer.

Embodiments of the current disclosure provide a one-port acoustic resonator, including: a substrate; a first conductive layer disposed on the substrate; a first titanium nitride (TiN) layer disposed on the first conductive layer; a one-port transducer formed on the first TiN layer, wherein the one-port transducer comprises: an HZO layer disposed on the first TiN layer; a molybdenum (Moly) layer disposed on the HZO layer; a second TiN layer disposed on the Moly layer; and a second conductive layer disposed on the second TiN layer.

Embodiments of the current disclosure provide a method of fabricating the one-port acoustic resonator, comprising, providing the substrate; depositing the first conductive layer on the substrate; depositing the first TiN layer on the first conductive layer; depositing the HZO layer on the first TiN layer; depositing the Moly layer on the HZO layer; depositing the second TiN layer on the HZO layer; depositing the second conductive layer on the second TiN layer; patterning the second conductive layer, the second TiN layer and the HZO layer to form the one-port transducer; and releasing the one-port acoustic resonator by etching a trench around and removing the substrate.

Optionally, the HZO layer is deposited by applying atomic layer deposition (ALD).

Embodiments of the current disclosure also provide a method of fabricating a two-port acoustic resonator, including: providing a silicon-on-insulator substrate; depositing a first aluminum nitride (AlN) layer on the substrate, wherein the first AlN layer is a seed layer; depositing a first molybdenum (Moly) layer on the first AlN layer; depositing a second AlN layer on the first Moly layer; depositing a second Moly layer on the second AlN layer; patterning the second Moly layer to define a first transducer; using atomic layer deposition to deposit a first hafnium zirconium oxide (HZO) layer on the second Moly layer; depositing a first titanium nitride (TiN) layer on the first HZO layer; depositing a first conductive film on the first TiN layer; patterning the first conductive layer, the first TiN layer and the first HZO layer to form the second transducer; patterning and depositing a second conductive layer on the second transducer; and releasing the two-port acoustic resonator by etching a trench around and removing the substrate.

BRIEF DESCRIPTION OF DRAWINGS

FIGS. 4(1) to 4(8) illustrate a step-by-step fabrication process flow of the two-port resonator, according to one embodiment of the current disclosure.

DETAILED DESCRIPTION

Figure 1:
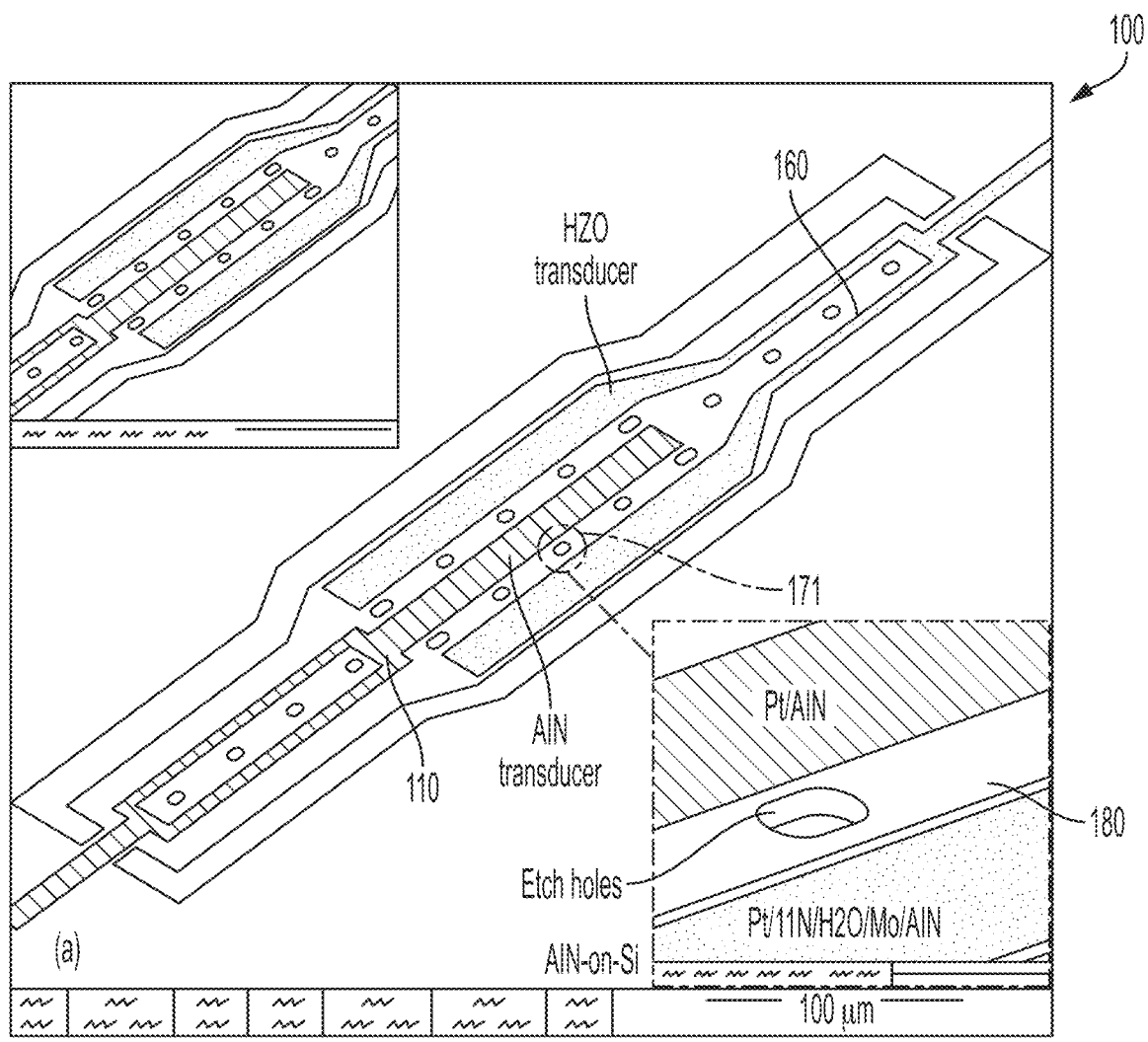
FIG. 1 illustrates a two-port resonator according to an embodiment of the current disclosure.

It should be understood that the examples and embodiments described herein are for illustrative purposes only and that various modifications or changes in light thereof will be suggested to persons skilled in the art and are to be included within the spirit and purview of this application.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The disclosed nanoscale acoustic resonator uses the piezoelectric properties of a 10 nm ferroelectric hafnium-zirconium oxide (HZO) film for transduction of nano-mechanical resonators. The HZO film may be deposited using atomic layer deposition (ALD) among other methods. Though HZO is known to have been studied for FeFET and FeRAM devices, it has not yet been applied in piezoelectric transducers. Three unique characteristics of ferroelectric HZO stand out that are transformative for advanced devices: in comparison with other ferroelectric materials CMOS compatibility, occurrence of ferroelectricity, and hence piezoelectricity, in sub-10 nm films, and the capability to engineer the ferroelectric properties by applying atomic layer deposition (ALD) of mono-layers of dopants, a widely used CMOS process technique. Furthermore, the extreme thickness scaling makes it a promising candidate for nano-acoustic resonators in the mm-wave regime. Finally, the conformal nature of ALD enables its 3D integration for the realization of fin-based resonators, and sidewall transducers for very-large-scale-integrated sensors and actuator arrays.

Atomically Engineered HZO Film

ALD deposited $HfO_2$:$ZrO_2$ (HZO) films are typically amorphous structured due to the low thermal budget during ALD deposition but can be phase transformed into crystallinity with an annealing process such as the rapid thermal annealing (RTA). The non-centrosymmetric orthorhombic crystal phase achieved after RTA exhibits a ferroelectric behavior. A capping layer, such as titanium nitride (TiN), helps suppress the monoclinic phase and promotes the orthorhombic phase during the RTA process. Doped $HfO_2$ material has been explored extensively for ferroelectricity, however the choice of 1:1 binary $HfO_2$:$ZrO_2$ is driven by its low annealing temperature and high polarization. The substrate or bottom electrode on which HZO is grown has been shown to have a pronounced effect on its ferroelectric response and thus demonstrating piezoelectricity. The films grown on a substrate of (002) c-axis oriented aluminum nitride (AlN) and then sputtered Mo subsequently on top have been observed to show a higher polarization than films grown on a substrate of Ge or a substrate of TiN/Si as the bottom electrode. The ferroelectric nature of HZO can be further exploited to tune the material properties with an applied DC voltage or to permanently reorient the spontaneous polarization. Unlike a piezoelectric material (PZT), the HZO has an order of magnitude higher coercive field strength, which increases HZO resilience to internal depolarization or signal fluctuations, thus enhancing its material tuning capability for piezoelectricity while the ferroelectric HZO film which is an order of magnitude thinner, compared to other ferroelectric films, allows the high field to be obtained at comparably lower voltages. The high-k dielectric nature of HZO along with its piezoelectricity character can be used for dual electrostatic/piezoelectric hybrid-actuation in one embodiment.

Multi-Morph Resonator Design

An exemplary multi-morph nano-mechanical resonator is used for characterization of HZO piezoelectric properties. Benefiting from two independent piezoelectric transduction ports (i.e. HZO and AlN), various drive/sense mechanisms can be fabricated. Two-port resonators with asymmetric transducer designs (port-1 AlN, port-2 HZO) are made to evaluate the frequency response for HZO-actuate/AlN-sense driving mechanism. FIG. 1 shows a SEM image of two-port resonator 100. In FIG. 1, 110 is port-1, an AlN transducer while 160 is port-2 a 10 nm HZO transducer. The inset-top shows a close-up image of the transducer region. The inset-bottom shows the zoomed-in image of one etch hole 171.

Figure 2:
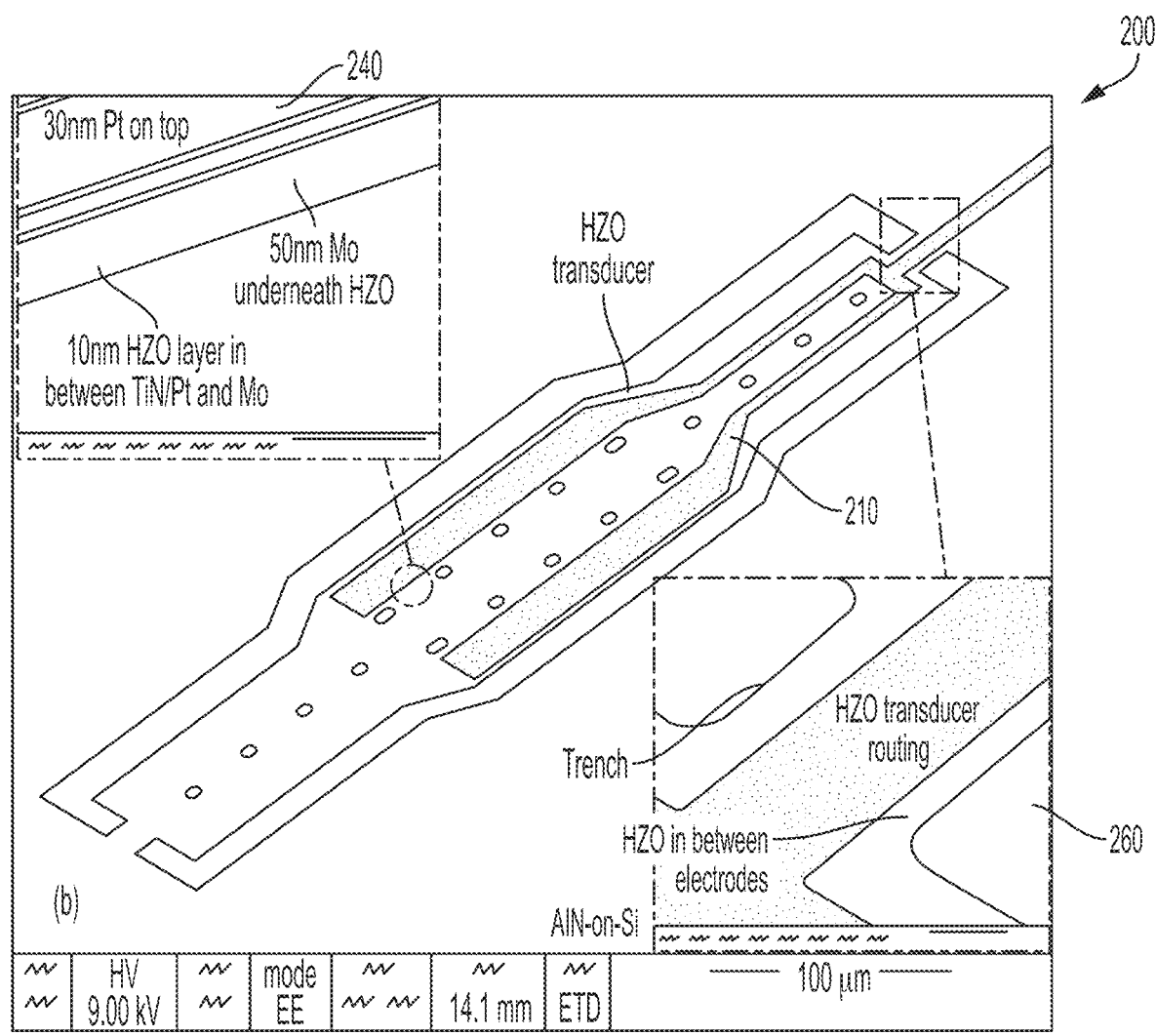
FIG. 2 illustrates a one-port resonator according to another embodiment of the current disclosure.

To avoid the potential interference of AN, an alternative architecture with one port HZO only transducer is also fabricated as shown in FIG. 2, which is a SEM image of the 1-port HZO transduced resonator 200. 210 is a 10 nm HZO transducer port. The 10 nm HZO is sandwiched between 30 nm/10 nm Pt/TiN on the top and 50 nm Mo underneath. The wider HZO region helps avoid plausible shorting between the electrodes thus enabling viable transduction. The inset-bottom 260 shows routing of HZO transducer following same strategy as inset-top 240 to avoid shorting of electrodes.

The inset-top 240 shows a close-up image of the port region. The HZO has a stack including 30 nm Pt as electrode, 50 nm Mo film, 10 nm HZO film between TiN/Pt and the Mo film. The inset-bottom 260 shows the zoomed-in image of the port area. There is a trench isolating the electrodes on each side, HZO film in between the electrodes.

Figure 3A:
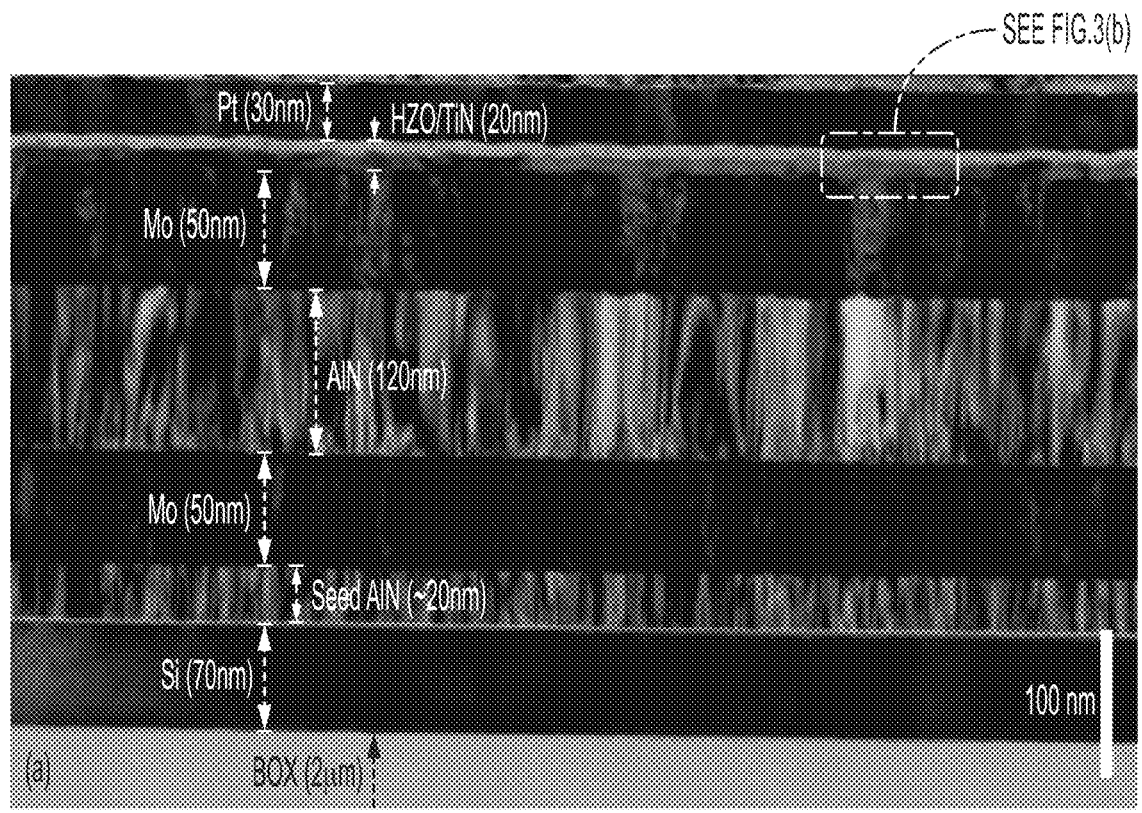
FIG. 3(a) shows an HR-XTEM image of the transducer stack.
Figure 3B:
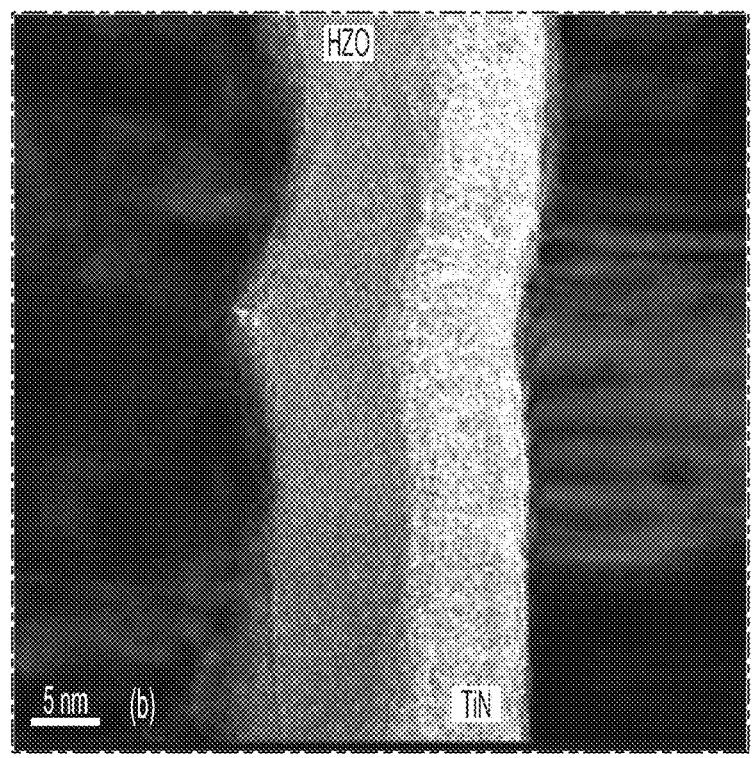
FIG. 3(b) shows the zoomed-in view of the 10 nm/10 nm HZO/TiN layers in FIG. 3(a).

FIG. 3(a) details the resonator stack through the high-resolution cross-sectional TEM (HR-XTEM) image of the structure in FIG. 2. The resonator is formed by stacking TiN/HZO, Mo/c-axis oriented AlN/Mo, and Si. Shown in FIG. 3(a) is the full resonator stack of Pt/TiN/HZO/Mo/AlN/Mo/AlN/Si. Platinum electrode is on the top layer, FIG. 3(b) is a zoomed-in SEM image of the 10 nm HZO/10 nm TiN layers. The high resolution XTEM demonstrates the individual thicknesses of the materials in the stack. The c-axis oriented 120 nm AlN is evident on top of 50 nm Mo. The crystal diffraction patterns are evident in HZO indicating the crystalline form of HZO. The conformal ALD deposition of HZO is unaffected by the topography of the proximate surface.

Fabrication Process

In accordance with one aspect of the present invention, a fabricating method described in FIG. 4 summarizes the fabrication process used for implementation of the multi-morph nano-mechanical resonator.

As shown in FIG. 4(1), a layer of, e.g., 50 nm molybdenum (Mo) layer is first sputtered on top of a 70 nm device layer on a SOI substrate. Next an AlN film of thickness 120 nm is magnetron-sputtered on the Molybdenum (Mo) layer, followed by another sputtered Mo layer, to form a Mo/AlN/Mo sandwich. In FIG. 4(2), top Mo is patterned to form the ground (GND) for the HZO transduction port. In FIG. 4(3), a thin 10 nm-HZO/10 nm-TiN stack is then ALD deposited over the patterned Mo surface. An exemplary technique to create the stack may use alternating series of chemical precursor pulses in the ALD deposition: tetrakis (dimethylamino) zirconium (IV), followed by water ($H_2O$) to oxidize the layer and tetrakis (dimethylamido) hafnium (IV), again followed by $H_2O$ for oxidation. By alternating equal cycles of $HfO_2$ and $ZrO_2$ a 1:1 binary ratio, a layer of 10 nm HZO is achieved. This is followed by tetrakis (dimethylamido) titanium (IV) flow and a series of nitrogen plasma cycles in order to deposit the thin 10 nm TiN capping layer. In FIG. 4(4), the TiN capping layer is then selectively patterned from (litho-etch) for the HZO transduction regions using a $Cl_2/H_2$ gas-based plasma etch process. In FIG. 4(5), HZO is then etched using a wet etch process such as the BOE (buffered oxide etch), to expose AlN in all regions except the HZO transducer area. Following HZO/TiN selective etching, RTA at 500° C. for about 20 seconds is applied to crystalize the HZO layer into its ferroelectric phase. The crystalline form of the HZO film is evident from the diffraction pattern shown in TEM image in FIG. 3(b). In FIG. 4(6) a layer of 30 nm platinum (Pt) is deposited with sputtering to serve as $RF_{in/out}$ electrodes, which are then patterned using a liftoff process. In FIG. 4(7), a selected area at the bottom Mo layer (serving as GND for the AlN transducer) is exposed by litho-dry etch of the 120 nm AlN outside the device area. In FIG. 4(8), the lateral geometry of the device is then defined with selective etching of the 120 nm AlN/50 nm Mo/70 nm Si in a RIE/ICP (reactive ion etch with inductively coupled plasma process). Finally, the devices are released from the top side by etching the buried oxide layer through the trench and etch holes using Hydrofluoric acid (HF) acid.

Characterization Results

Various electrical and optical characterization schemes are used to evaluate the performance of the resonators, and the ferroelectric and piezoelectric properties of HZO.

Figure 5A:
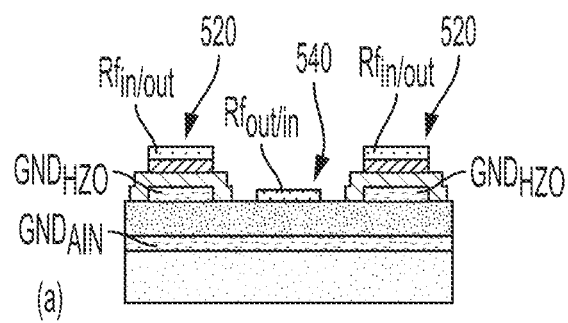
FIG. 5(a) illustrates a structural schematics of a 2-port resonator having AlN-drive and HZO-sense or vice versa, according to one embodiment of the current disclosure.

FIG. 5(a) illustrates a drive/sense a mechanism applied in characterizing the 2-port resonator, according to one embodiment of the current disclosure. The resonator has two symmetric HZO electrodes 520 and one AlN electrode 540. The AlN electrode 540 can be used as the drive electrode and HZO electrode 520 can be used as the sense electrode, or vice versa, the drive and sense are interchangeable. The resonator is actuated and sensed using a drive/sense. The drive and sense electrodes are interchangeable.

Beside 2-port electrical characterization, the HZO-only transduced resonator 200 disclosed in FIG. 2 is optically characterized by monitoring the out-of-plane vibration amplitude using a digital holographic microscope (DHM) and the results are compared with an AlN-only transduced counterpart. Such a comparison enables characterization of piezoelectric coefficient of HZO, resulting in coefficient $e_{31,HZO} \approx 2.3 e_{31,AlN}$.

Figure 5B:
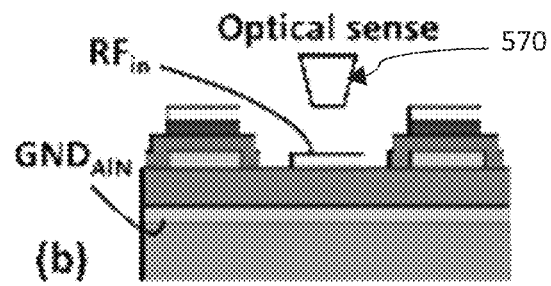
FIG. 5(b) illustrates a structural schematics of a resonator with AlN-drive and optical sense, measured using digital holographic microscope or DHM, according to one embodiment of the current disclosure.

FIG. 5(b) illustrates an electrical drive and optical sense mechanism applied in characterizing the 2-port resonator, according to another embodiment of the current disclosure. An optical sense end 570 is applied to measure the out-of-plane vibration of the resonator, using a digital holographic microscope (DHM). The resonator has an AlN-drive transducer and optical sense end 570.

Figure 5C:
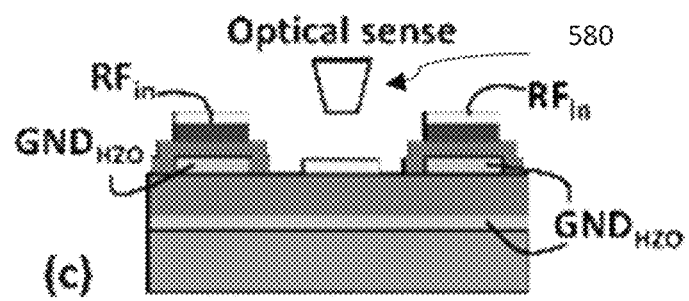
FIG. 5(c) illustrates a structural schematics of a resonator with HZO-drive and optical sense measured by DHM for vibrations, according to one embodiment of the current disclosure.

FIG. 5(c) illustrates an electrical drive and optical sense mechanism applied in characterizing the 2-port resonator, according to another embodiment of the current disclosure. An optical sense end 580 is applied to measure the out-of-plane vibration of the resonator, using a digital holographic microscope (DHM). The resonator has an HZO-drive transducer with optical sense 580 end.

Figure 6:
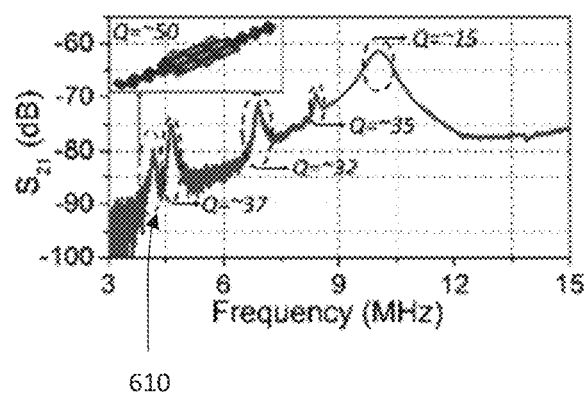
FIG. 6 characterizes the frequency response in the 2-port resonator disclosed in FIG. 1.

FIG. 6 shows a frequency response curve of the 2-port resonator disclosed in FIG. 1. The frequency response curve is measured as the resonator is actuated and sensed using the drive/sense mechanism disclosed in FIG. 5(a), in an operating range from 3 MHz to 15 MHz on the 2-port resonator design shown in FIG. 1. In FIG. 6, a resonance peak 610 is observed with a $Q_{max}$ of ~50 (in air) at nearly 4.1 MHz frequency.

There are other architectures of resonators using the nanoscale 10 nm Hafnium-Zirconium Oxide (HZO) as a transducer for the resonator technology, spanning across VHF (300 MHz>f>30 MHz), UHF (3 GHz>f>300 MHz) and SHF (30 GHz>f>3 GHz) frequency bands which are needed for the future RF front-ends. Following data demonstrates the frequency response of different resonator architectures using 10 nm Hafnium Zirconium Oxide (HZO) as a piezoelectric transducer.

For example, width-extensional (WE) acoustically engineered waveguide-based resonators of orders of first, third, fifth, seventh, etc. have been designed and analyzed. The first WE resonator (not shown here) operates at ~37 MHz has a Q of ~400.

Figure 7A:
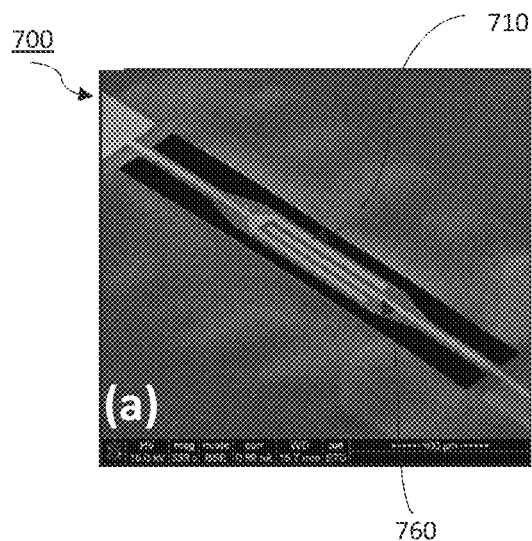
FIG. 7(a) shows a SEM image of a 3rd WE (width-extensional) resonator actuated using HZO transducer and sensed using AlN transducer, according to another embodiment of the current disclosure.
Figure 7B:
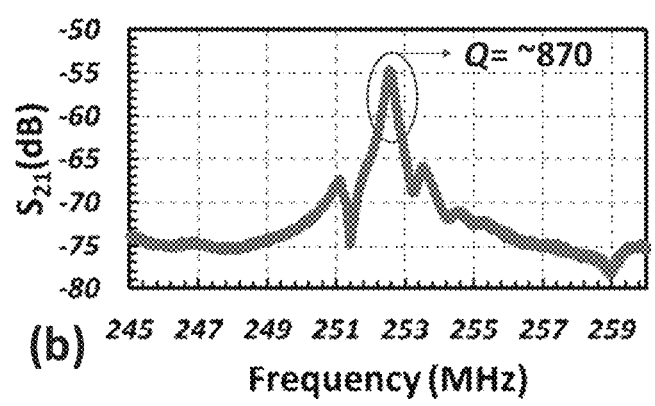
FIG. 7(b) is the frequency response of the 3rd WE resonator of FIG. 7(a) having a resonant peak at ~253 MHz with Q factor of ~870.

FIG. 7(a) shows the SEM image of a 3rd width-extensional (WE) resonator according to an embodiment of the disclosure. The acoustically engineered waveguide-based resonator 700 is designed to have a 10 nm HZO transducer 710 as the actuator on top of a 70 nm single crystal silicon (SCS), and an AlN transducer 760 as the sense transducer. The frequency response in FIG. 7(b) shows a quality factor (Q) of ~870 for this 3rd WE mode resonator at a frequency 253 MHz.

Figure 8:
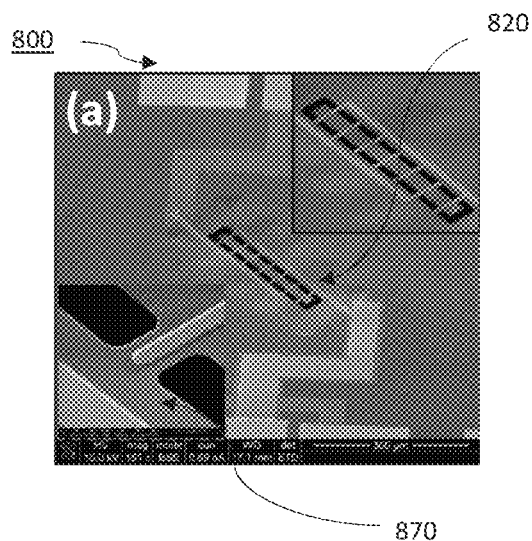
FIG. 8(a) demonstrates a SEM image of a 7th WE Bulk Acoustic Resonator (BAR) architecture 800, according to another embodiment of the current disclosure.
FIG. 8(b) is the frequency response of the $7^{th}$ WE BAR resonator disclosed in FIG. 8(a).

FIG. 8(a) demonstrates a SEM image of a 7th WE Bulk Acoustic Resonator (BAR) architecture 800, according to another embodiment of the current disclosure. The BAR resonator 820 is actuated by a 10 nm HZO transducer and sensed from AlN transducer. The lower inset 870 shows detailed AlN transducer end, the frequency response shows a Q of ~750 at ~413 MHz.

Figure 8B:
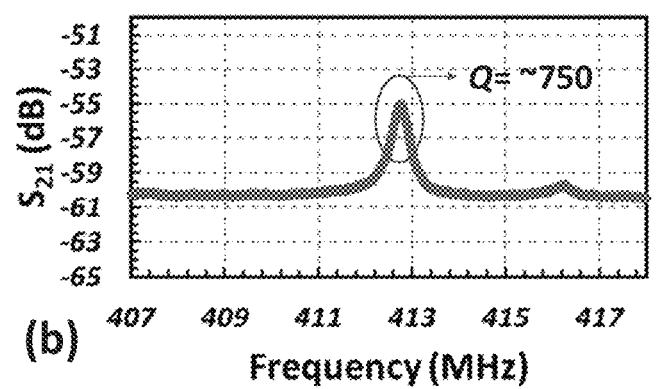

FIG. 8(b) is the frequency response of the $7^{th}$ WE BAR resonator disclosed in FIG. 8(a). A resonant peak is observed at 412 MHz with Q ~750.

Figure 9A:
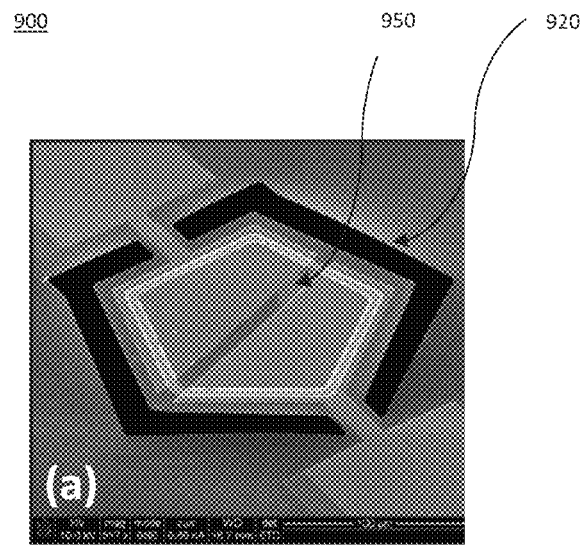
FIG. 9(a) shows a SEM image of thickness extensional (TE) bulk acoustic resonator (BAR), according to another embodiment of the current disclosure.
Figure 9B:
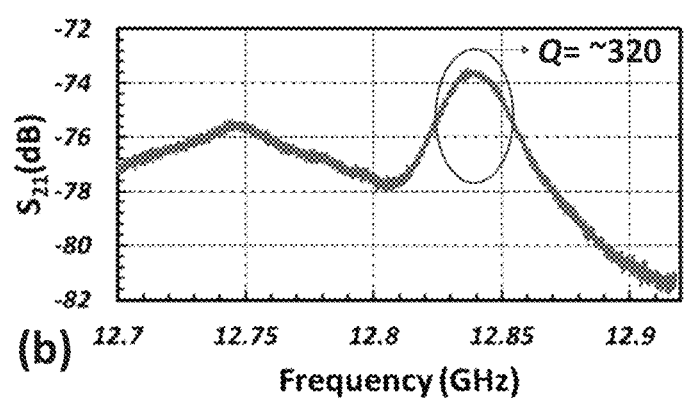
FIG. 9(b) shows the frequency response of the resonator in FIG. 9(a).

FIG. 9(a) demonstrates a SEM image of a thickness extensional (TE) BAR architecture 900, according to another embodiment of the current disclosure. The TE BAR resonator 900 has a ~50 nm gold (Au) border ring 920 to acoustically trap the energy in the central region of the device. There is 10 nm HZO transduced resonator 950 inside the ring 920. The resonator 950 is actuated using HZO transducer and sensed using AlN transducer. In FIG. 9(b) a resonant peak is observed which has Q of ~320 at ~12.8 GHz.

Figure 10:
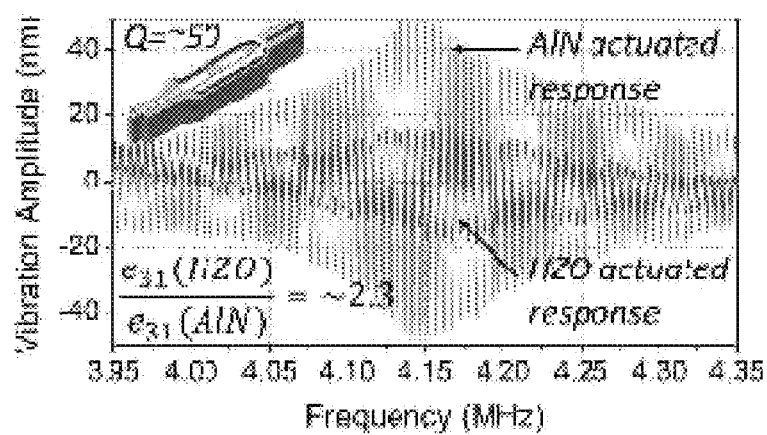
FIG. 10 illustrates measured out-of-plane vibration amplitude using driving mechanisms in FIG. 5(b) and FIG. 5(c).

FIG. 10 illustrate measured out-of-plane vibration amplitude for mode at ~4.1 MHz actuated using HZO driving and AlN driving mechanisms. With drive=2V, the AlN-actuated vibration amplitude is ~50 nm while HZO-actuated amplitude is ~20 nm. Therefore the vibration amplitude comparison indicate $e_{31,HZO} \approx 2.3 e_{31,AlN}$.

Figures 11A, 11B:
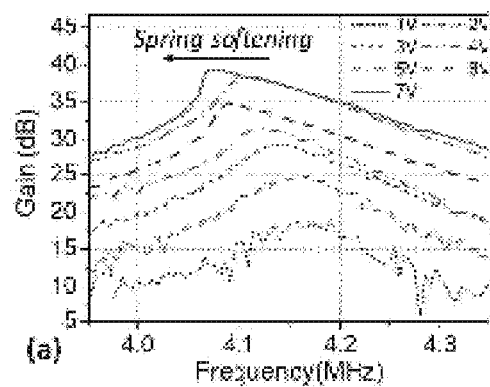
FIG. 11(a) illustrates the short-span frequency response of a 2-port transducer with driving scheme shown in FIG. 5(c)
FIG. 11(b) shows the short-span frequency response of a 2-port transducer with driving scheme shown in FIG. 5(b).

FIG. 11(a) illustrates measured short-span frequency responses with power handling for ~4.1 MHz mode with HZO driving scheme.

FIG. 11(b) illustrates the short-span frequency responses of a 2-port transducer with an AlN drive, with power handling for the same mode. The AlN transducer is driven to non-linearity much sooner compared to HZO due to large vibration amplitude for the same bias voltage as shown in FIG. 10. The gain for the respective mode is derived using the vibration amplitudes captured using DHM at different input biases. The short-span frequency response of the resonators in FIG. 11 demonstrated nonlinear operation regimes as various excitation voltages applied to HZO- and AlN-transduction ports respectively.

Figure 12A:
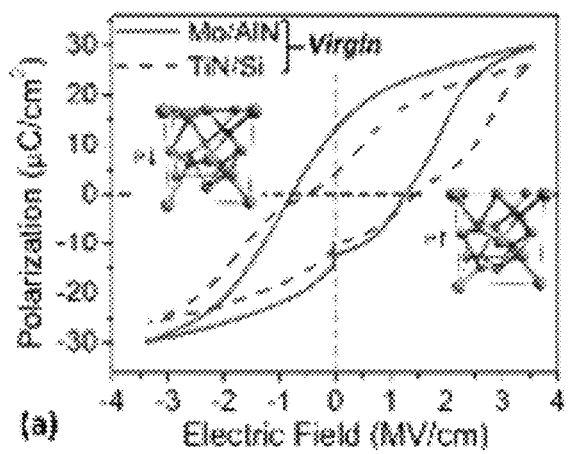
FIG. 12(a) illustrates the hysteresis curves for HZO transducers, according to an embodiment of the subject invention.
Figure 12B:
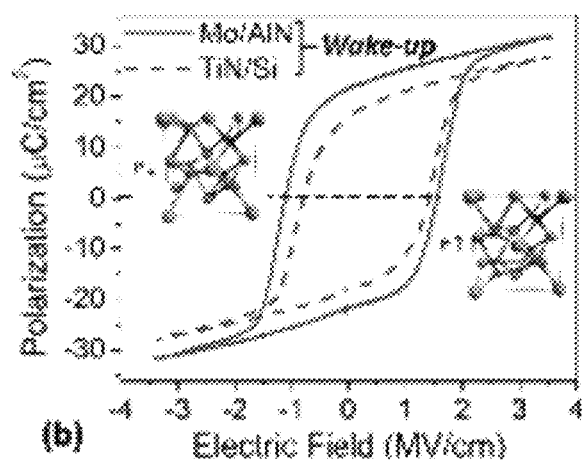
FIG. 12(b) illustrates the hysteresis curves for HZO transducers after wakeup using 10 k cycles of a bipolar square wave at 1 kHz of the transducers in FIG. 12(a).

FIG. 12(a) and FIG. 12(b) illustrate the hysteresis curves for HZO transducers. In FIG. 12(a) the dashed curve shows the result of a 10 nm HZO on TiN/Si transducer and the solid line is for 10 nm HZO on Mo/AlN transducer in the virgin state (after RTA). FIG. 12(b) illustrates hysteresis curves of the same devices of FIG. 12(a) after 10 k cycles of a bipolar square wave at 1 kHz of the transducers (wake-up). The remnant polarization (Pr) for HZO/Mo/AlN is higher than that of HZO/TiN/Si used typically signifying higher ferroelectricity.

FIG. 12 compares the improved P-V response of 10 nm HZO on top of AlN/Mo with typical TiN/Si electrodes.

Figure 13:
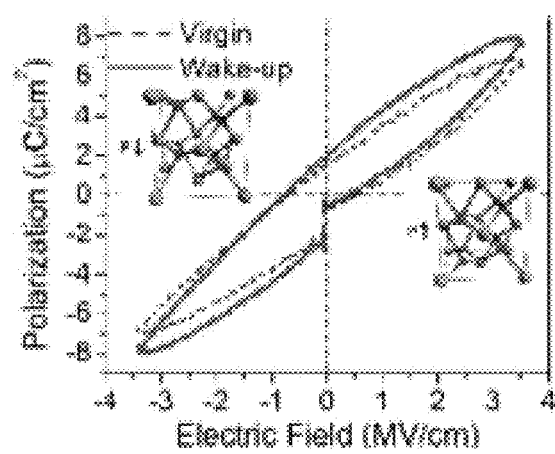
FIG. 13 illustrates the hysteresis curves for a 10 nm HZO transducers having a smaller ferroelectric capacitor area.

FIG. 13 shows the P-V response of the HZO on top of the resonator after the device release using HF acid. The reduced polarization (Pr) compared to FIG. 12 is attributed to the effect of HF etch on HZO through the trench and etch holes and the smaller ferroelectric capacitor area on resonator. The P-V response can be improved through exploiting backside dry-release and increasing the transduction area.

Figure 14:
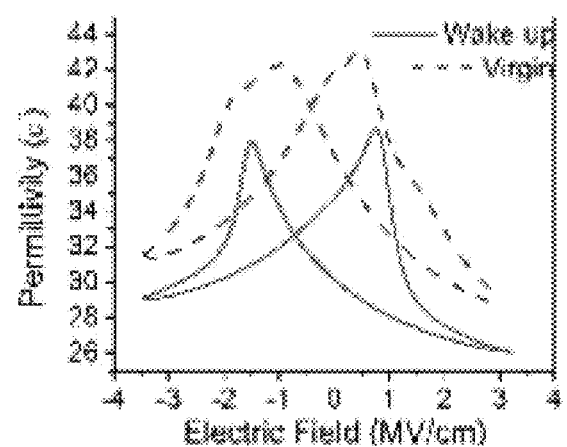
FIG. 14 illustrates the permittivity vs voltage curves for an HZO transducer, according to an embodiment of the subject invention.

FIG. 14 reveals the signature dual CV peaks for ferroelectric materials. The peaks are more pronounced after wake-up (solid) than the virgin (dashed). The tunable high-k dielectric nature of HZO is evident.

Figure 15:
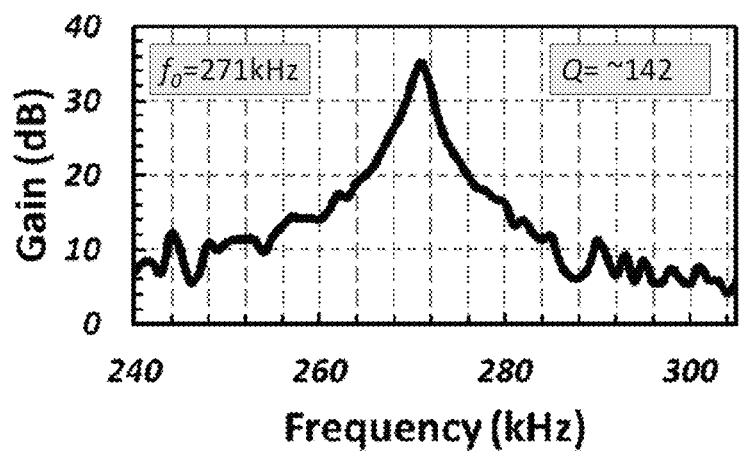
FIG. 15 illustrates a gain plot for the HZO-on-Silicon resonator, according to an embodiment of the subject invention.

FIG. 15 illustrates a gain plot for Hafnium Zirconium Oxide (HZO)-on-Silicon resonator, according to an embodiment of the subject invention. One embodiment of the invention is the direct demonstration of HZO on Silicon resonator. FIG. 15 shows the frequency response of one such resonator implemented using 10 nm HZO on top of 70 nm Silicon with titanium nitride (TiN) electrodes. The entire resonator stack includes: 30 nm Pt/10 nm TiN / ferroelectric 10 nm HZO/30 nm TiN/70 nm Silicon. The top (30 nm Pt/10 nm TiN) acts as top electrode while 30 nm TiN below HZO acts as bottom electrode for the resonator actuation/sensing.

Figure 16:
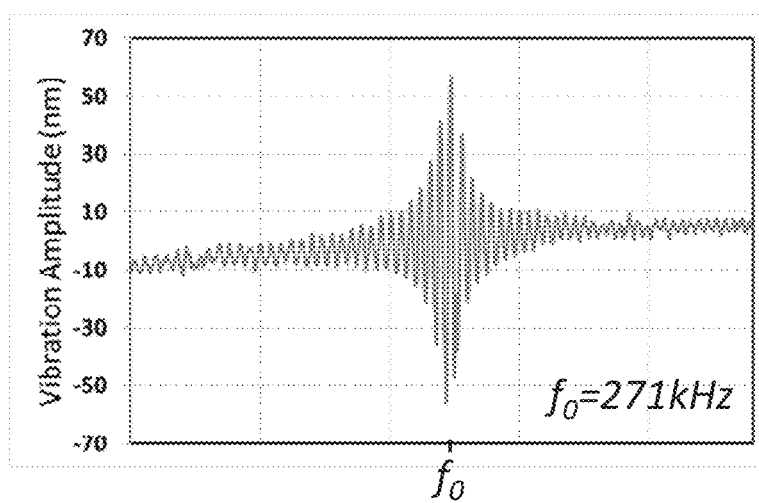
FIG. 16 illustrates the out-of-plane vibration amplitude for HZO-on-Silicon resonator vs. frequency, according to an embodiment of the subject invention.

FIG. 16 illustrates out of plane vibration amplitude for HZO-on-Silicon resonator vs. frequency for a resonator demonstrated in FIG. 15. The frequency response is swept around ~271 kHz for $6V_{pp}$ bias voltage. The peak-to-peak vibration amplitude of ~100 nm is observed at $f_0$.

In summary, the disclosure demonstrates the piezoelectric transducer having a 10 nm ferroelectric HZO film which is fabricated with CMOS-compatible techniques. Atomically deposited ferroelectric HZO films are engineered to demonstrate large piezoelectric properties, and used for excitation of multi-morph nano-mechanical resonator. Various schemes, including isolated HZO- and AlN-transduction ports, along with different electrical and optical characterization are used to extract the ferroelectric and piezoelectric properties of HZO film. The demonstration of the 10 nm atomically engineered HZO with a large piezoelectric response paves the way for extreme miniaturization of nano-mechanical resonators to mm-wave regime and for 5G applications. Besides, the low-temperature and truly conformal nature of ALD, the HZO process offers substantial advantages over conventional magnetron-sputtered/MOCVD films, including CMOS-compatibility and sidewall transducer integration. Finally, the capability to engineer the material properties by varying the dopant layering to enhance ferroelectricity and piezoelectricity or by applying DC bias to tune them, increases the potential of piezoelectric HZO many-fold.

The above-mentioned embodiments are only used for exemplarily describing the principle and effects of the present invention instead of limiting the present invention. One skilled in the art may make modifications or changes to the above-mentioned embodiments without departing from the spirit and scope of the present invention. Therefore, all equivalent modifications or changes made by those who have common knowledge in the art without departing from the spirit and technical thought disclosed by the present invention shall be still covered by the claims of the present invention.

The invention claimed is:

1. A two-port acoustic resonator, comprising:
a substrate;
a first aluminum nitride (AlN) layer disposed on the substrate;
a first molybdenum (Moly) layer disposed on the first AlN layer;
a first transducer formed on the first Moly layer, wherein the first transducer comprises:
a second AlN layer disposed on the first Moly layer, and
a second Moly layer disposed on the second AlN layer; and
a second transducer formed on the second Moly layer, wherein the second transducer comprises:
a first hafnium zirconium oxide (HZO) layer disposed on the second Moly layer,
a first titanium nitride (TiN) layer on top of the first HZO layer, and
a first conductive layer deposited on the first HZO layer,
wherein the second transducer is located in the vicinity of the first transducer, and
wherein the second transducer comprises a second conductive layer disposed on the first Moly layer.

2. The two-port acoustic resonator according to claim 1, wherein the HZO layer is formed by applying atomic layer deposition (ALD).

3. The two-port acoustic resonator according to claim 1, wherein the HZO layer has a thickness ranging from 2 nm to 20 nm.

4. The two-port acoustic resonator according to claim 1, wherein a titanium nitride (TiN) layer is disposed on top of the HZO and the second Moly layer.

5. The two-port acoustic resonator according to claim 1, wherein the first conductive layer includes one of platinum (Pt), aluminum (Al), gold (Au), and silver (Ag).

6. The two-port acoustic resonator according to claim 1, wherein the second conductive layer includes one of platinum (Pt), aluminum (Al), gold (Au), and silver (Ag).

7. The two-port acoustic resonator according to claim 1, wherein the first AlN layer is a seed layer and the second AlN layer is a c-axis oriented crystalline layer.

8. The two-port acoustic resonator according to claim 1, wherein the substrate is a SOI having a device layer on a BOX layer.

9. The two-port acoustic resonator according to claim 1, wherein the second layer of AlN is a crystalline layer and have a thickness ranging from 50 nm to 5 um.

10. A method of fabricating a two-port acoustic resonator, comprising,
providing a silicon-on-insulator substrate;
depositing a first aluminum nitride (AlN) layer on the substrate, wherein the first AlN layer is a seed layer;
depositing a first molybdenum (Moly) layer on the first AlN layer;
depositing a second AlN layer on the first Moly layer;
depositing a second Moly layer on the second AlN layer;
patterning the second Moly layer to define a first transducer;
depositing a first hafnium zirconium oxide (HZO) layer;
depositing a first titanium nitride (TiN) layer on the HZO layer;
depositing a first conductive film on the first TiN layer;
patterning the first conductive film, the first TiN layer and the first HZO layer to form the first transducer;
patterning the second AlN layer to define a second transducer;
depositing a second conductive layer on the second transducer; and
releasing the two-port acoustic resonator by etching a trench around and removing the substrate.

11. The method of fabricating the two-port acoustic resonator as in claim 10, wherein the first HZO layer is deposited by applying atomic layer deposition.

12. The method of fabricating the two-port acoustic resonator as in claim 10, wherein the second HZO layer is deposited by applying atomic layer deposition.

13. The method of fabricating the two-port acoustic resonator as in claim 10, wherein the first HZO layer has a thickness ranging from 2 nm to 20 nm, and wherein the second HZO layer has a thickness ranging from 2 nm to 20 nm.

14. A one-port acoustic resonator, comprising:
a substrate;
a first conductive layer disposed on the substrate;
a first titanium nitride (TiN) layer disposed on the first conductive layer;
a one-port transducer formed on the first TiN layer, wherein the one-port transducer comprises:
an HZO layer disposed on the first TiN layer,
a molybdenum (Moly) layer disposed on the HZO layer, and
a second TiN layer disposed on the Moly layer; and
a second conductive layer disposed on the second TiN layer.

15. The one-port acoustic resonator according to claim 14, wherein the HZO layer is formed by applying atomic layer deposition (ALD).

16. The one-port acoustic resonator according to claim 14, wherein the HZO layer has a thickness ranging from 2 nm to 20 nm.

17. The one-port acoustic resonator according to claim 14, wherein the first conductive layer includes one of platinum (Pt), aluminum (Al), gold (Au), and silver (Ag).

18. The one-port acoustic resonator according to claim 14, wherein the second conductive layer includes one of platinum (Pt), aluminum (Al), gold (Au), and silver (Ag).

19. A method of fabricating the one-port acoustic resonator as in claim 14, comprising,
providing the substrate;
depositing the first conductive layer on the substrate;
depositing the first TiN layer on the first conductive layer;
depositing the HZO layer on the first TiN layer;
depositing the Moly layer on the HZO layer;
depositing the second TiN layer on the HZO layer;
depositing the second conductive layer on the second TiN layer;
patterning the second conductive layer, the second TiN layer and the HZO layer to form the one-port transducer; and
releasing the one-port acoustic resonator by etching a trench around and removing the substrate.

20. The method of fabricating the one-port acoustic resonator as in claim 19, wherein the HZO layer is deposited by applying atomic layer deposition (ALD).

\* \* \* \* \*